Feb. 18, 1969 LA VERN B. HOVENGA ET AL 3,428,916

COMPENSATED CRYSTAL OSCILLATORS

Filed April 14, 1967

INVENTORS
RONALD D. KIDMAN
HAROLD E. GRUEN
LA VERN B. HOVENGA
IVAN E HARDT

BY [signature]
ATTORNEY 3,428,916
COMPENSATED CRYSTAL OSCILLATORS

La Vern B. Hovenga and Ivan E. Hardt, Davenport, Iowa, Ronald D. Kidman, Jackson, Mich., and Harold E. Gruen, Santa Barbara, Calif., assignors to The Bendix Corporation, a corporation of Delaware Filed Apr. 14, 1967, Ser. No. 630,955
U.S. Cl. 331—116 3 Claims
Int. Cl. H03b 5/30

ABSTRACT OF THE DISCLOSURE

A crystal oscillator is shown in which provision is made for controlling oscillator frequency in accordance with a condition, specifically for maintaining frequency constant despite crystal temperature change, and for compensating for crystal and circuit aging. Control is accomplished by altering voltage applied to a voltage controlled capacitor in series with the crystal. Compensation for aging is accomplished with minimum effect on frequency control by trimmers connected with the crystal and the voltage controlled capacitor in one of several circuit configurations which are described.

This invention relates to improvement in compensated crystal oscillators and particularly to improvement in resonators of the kind that are useful in such oscillators.

An object of the invention is to provide means for shifting frequency of temperature compensated crystal oscillators with minimum effect on the degree of temperature compensation.

Another object is to provide a means for compensating for crystal and circuit aging in crystal oscillators and resonators whose frequency is controlled in response to the state of a condition.

A related object is to provide a crystal resonator which incorporates compensation means permitting independent adjustment for short term and long term changes in the resonant frequency of the crystal.

A further object is to provide a long term compensation means for resonators and for temperature compensated crystal oscillators which can be made lightweight and in miniature size.

These and other objects and advantages of the invention, which are apparent in the following specification, are realized in part by the combination in series of a piezoelectric crystal and a voltage adjustable capacitor, and by two capacitors connected in series combination across the voltage adjustable capacitor and crystal combination, and by a connection from the junction between the voltage adjustable capacitor and crystal to the junction between the other two capacitors, and in which that one of the latter which is in parallel with the crystal is adjustable.

Figure 1:
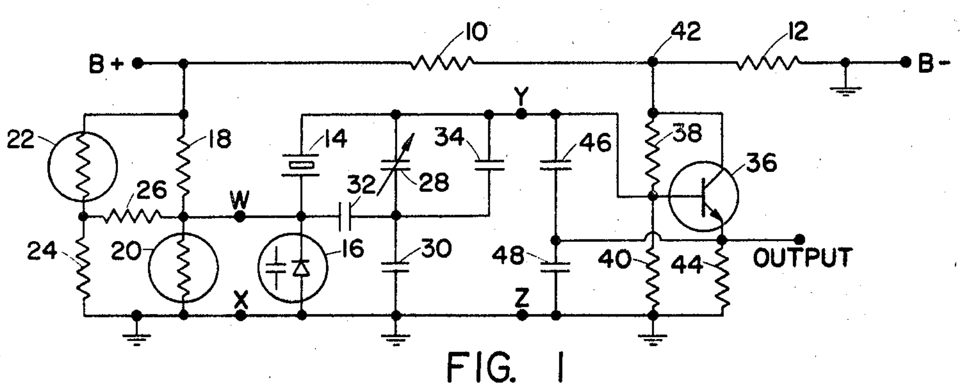
FIGURE 1 is a schematic circuit diagram of an oscillator embodying the invention and comprising a temperature compensation voltage circuit, a crystal resonator circuit and an active oscillator circuit.

In FIGURE 1, a voltage divider comprising the series combination of resistors 10 and 12 are connected to a regulated source of power from B plus to B minus at ground. The temperature compensation voltage circuit extends from B plus to ground at the left of terminals W and X in FIGURE 1. The resonator circuit extends from terminals W–X at the left to terminals Y–Z at the right. The oscillator circuit, without the resonator, extends from the voltage divider at the junction of resistors 12 and 10 to ground at the right of terminals Y–Z. Terminals X and Z are common at ground potential.

Figure 2:
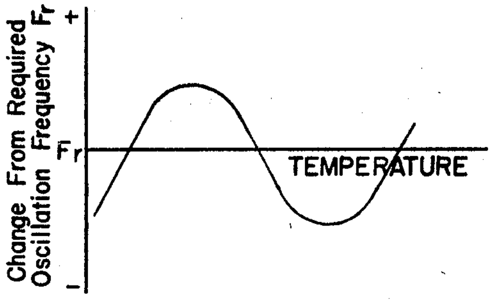
FIGURE 2 is a graph showing a curve of frequency change from a desired or required frequency as an incident to change in temperature of the crystal of FIGURE 1.

The primary oscillator frequency controlling element is the crystal 14. Other kinds of piezoelectric crystal may be employed and other quartz crystal cuts may be used, but the preferred embodiment shown in FIGURE 1 has its crystal made from AT-cut quartz. Such crystals have the frequency vs. temperature characteristics drawn in FIGURE 2. This characteristic results because the impedance exhibited by the crystal changes with temperature. The oscillation frequency of such crystals can be made more uniform with temperature by connecting them in an oscillatory circuit and modifying the reactance of that circuit to "pull" the frequency to crystal oscillation to a desired or required frequency. Such modification may be accomplished, as shown, by connecting a semiconductor junction in series with the crystal and impressing a variable voltage across the junction to change the capacitance and capacitive reactance exhibited by the junction. There are available a wide variety of semiconductor junctions constructed to exhibit substantial change in capacitive reactance per unit voltage change and they are called voltage variable capacitors or voltage controlled capacitors. One of these, designated 16, is connected in series with crystal 14 across terminals W–X. The voltage variable capacitor 16 has the capacitance values shown in FIGURE 3 with temperature when the voltage applied to terminals W–X varies with temperature as shown by the dashed curve in FIGURE 3.

Figure 3:
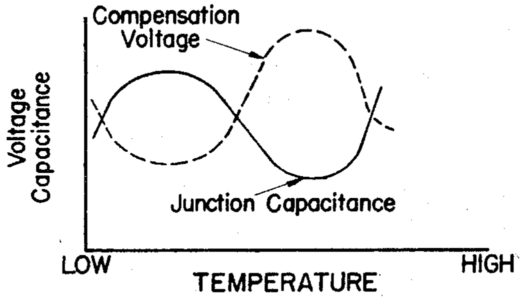
FIGURE 3 is a graph showing the variation in compensation voltage with temperature that is applied to the semiconductor junction in series with the crystal of FIGURE 1 and the variation with temperature in the capacitance exhibited by the junction.

This compensation voltage is derived from the source at B plus and is made to vary at terminals W–X as shown in FIGURE 3 by the inclusion in the temperature compensation voltage network of resistors whose value varies with temperature. The network shown in FIGURE 1 is a preferred one of a number of suitable circuit arrangements shown in the literature relating to temperature compensated oscillators. It comprises a fixed resistor 18 and a temperature sensitive resistor 20 connected in series from B plus to ground in parallel with the series combination of temperature sensitive resistor 22 and fixed resistor 24. A fixed resistor 26 connects the junction of resistors 22 and 24 with the junction of resistors 18 and 20. Terminals W–X are connected across temperature sensitive resistor 20.

In addition to crystal 14 and voltage adjustable capacitor or junction 16, the resonator comprises the series combination of variable capacitor 28 and fixed capacitor 30 connected from terminal Y to terminal Z in parallel with the crystal 14 and semiconductor junction 16. A coupling capacitor 32 connects the junction of the crystal and semiconductor junction to the junction of capacitors 28 and 30 such that variable capacitor 28 is in parallel with crystal 14. A fixed capacitor 34 connected in parallel with variable capacitor 28 alone, is included to fix the minimum capacitance in this circuit leg.

The oscillator has the Colpitts configuration and uses an NPN transistor 36. While other configurations may be employed, the one shown is advantageously used and is now preferred. Bias for the transistor is established by the series combination of resistors 38 and 40. Resistor 38 is connected from the source voltage divider, between resistors 10 and 12 at junction 42, to the transistor base. Resistor 40 is connected between the base and ground. The transistor collector is connected to the source voltage divider at junction 42. The emitter is connected to ground through the stabilizing and output resistor 44. The capacitor divider network that characterizes Colpitts oscillators is formed by capacitors 46 and 48 connected in series from terminal Y and the transistor base to terminal Z at ground. The feedback connection extends from the transistor emitter to the junction of capacitors 46 and 48 and the output signal is taken from the transistor emitter at the OUTPUT terminal.

Representative values for the various voltages and components, and the actual values for the embodiment shown are:

| | | |
|---|---|---|
| Crystal **14**, AT-cut | mHz | 4.096 |
| Resistors: | | |
| **38** | ohms | 10,000 |
| **40** | do | 51,000 |
| **44** | do | 5,100 |
| Capacitors: | | |
| **28** | picofarad | 1–16 |
| **30** | do | 240 |
| **32** | do | 8 |
| **34** | do | 24 |
| **46** | do | 180 |
| **48** | do | 140 |
| Transistor **36**, Type 2N2369 | | |
| Voltage at: | | |
| B plus | volts | 6 |
| Junction **42** | do | 2 |

Elements 18, 20, 22, 24, 26 and 16 are selected in a compensation procedure to match the crystal characteristic over a selected temperature range by plotting the crystal characteristic over that range and synthesizing the compensation network by network calculation.

Prior art circuits did not include capacitors corresponding to capacitors 28, 30, 32 and 34. It was known instead to employ a single variable capacitor such as capacitor 50, in FIGURE 4, connected in parallel with the crystal 14 and voltage controlled capacitor 16 in series. The need for such a capacitor arises because of a number of time related factors that operate to change the natural resonant frequency of the crystal or the circuit in which the crystal is connected or both. This effect is often called "aging" and in the case of quartz crystals it is a significant and predictable effect that continues over a very long time. The effect can be summarized and visualized by considering that it operates, except in certain special crystals, to translate downwardly the curve in FIGURE 2. Thus the effect is to decrease frequency substantially independently of crystal temperature.

Experimentation suggests that the change in crystal impedance resulting from a given temperature change may be some fixed or nearly fixed percentage of its internal impedances at natural resonant frequency. Crystal aging is understood to result from change in the internal impedances from their value at initial natural resonant frequency. Putting these two considerations together leads to the conclusion that two compensation measures must be taken to preserve at initial frequency the operation of of a temperature compensated crystal resonator or oscillator. First, it is necessary to alter the impedance of the circuit external to the crystal by an amount, at some temperature, equal and opposite to the change in crystal frequency. This will "pull" the crystal operation back to the required frequency at that temperature. Second, it is necessary to alter the range over which the junction capacitance is changed so that the ratio of the new range to the new crystal impedance corresponds to the ratio of the old range to the initial crystal impedance.

Figure 4:
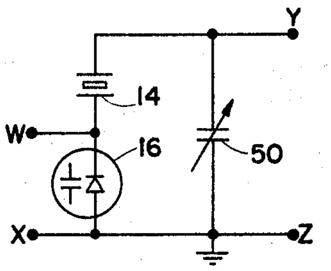
FIGURE 4 shows a resonator circuit including the prior art arrangement for compensation for crystal and circuit aging.

Turning to FIGURE 4, adjustment of capacitor 50 alters the impedance external to crystal 14 whereby crystal frequency can be pulled back after crystal aging to initial frequency at some temperature. Thus, capacitor 50 can be used to accomplish the first compensation measure. However, changing capacitor 50 has no effect on the ratio of the range of temperature compensation capacitance change in capacitor 16 to the impedance of the crystal. Thus, such a change is not effective to accomplish the second compensation measure.

Figure 5:
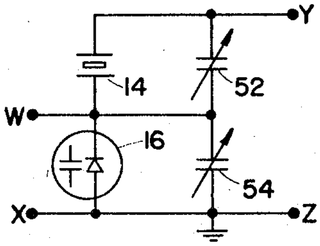
FIGURES 5 and 6 show resonator circuits embodying the invention.

Applicants have discovered that both compensation measures can be effected by employing the circuit of FIGURE 5. In that circuit, two variable capacitors 52 and 54 are connected in series across crystal 14 and voltage controlled semiconductor junction 16 from terminal Y to ground and the junction between semiconductor junction 16 and crystal 14 at terminal W and the junction between capacitors 52 and 54. Thus, capacitor 52 parallels the crystal and capacitor 54 parallels the semiconductor capacitor 16. The two capacitors 52 and 54 are related to one another in impedance magnitude as a function of the way that the crystal 14 and voltage control capacitor 16 impedance magnitudes are related. Both capacitors are varied in the same direction to accomplish compensation and in one embodiment they are ganged for simultaneous adjustment.

The circuit diagram in FIGURE 5 is arranged so that operation can be more readily envisioned. Capacitor 52 and crystal 14 are arranged side by side. Changing capacitor 52 obviously alters the impedance external to the crystal and a change in current in controlled capacitor 16 is applied proportionally to the crystal and capacitor 52. At each setting of capacitor 54, the capacitance across the parallel combination of capacitors 16 and 54 is changed and the range of capacitance across the combination as capacitor 16 is changed is altered. Thus changing capacitor 54 changes the range of effective change of capacitor 16. Capacitor 52 accomplishes the first kind of compensation and capacitor 54 accomplishes the second compensation measure mentioned above.

However, the effect of changing capacitors 52 and 54 is not applied only to crystal 14 and capacitor 16, respectively. Thus a change in capacitor 54 changes the impedance which is seen looking back into the circuit from the crystal and results in crystal pulling. Also, a change in capacitor 52 alters magnitude and phase of the alternative voltage drop across controlled capacitor 16. This interaction, unless itself counteracted, will vitiate compensation. But interaction is nullified so that compensation is properly effected. While an increase in capacitor 52 tends to increase the alternating voltage drop across compensation capacitor 16 because they are in series, capacitor 54 is also increased so that the drop across compensation capacitor 16 tends to decrease. The two capacitors can be adjusted, individually or together if they are made to track, so that the crystal sees the requisite impedance and so that the range of compensation capacitance in capacitor 16 is compressed or expanded as required.

Figure 6:
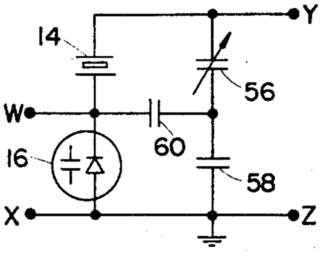

Variable capacitors occupy more space and are heavier than fixed capacitors of similar rating. In equipment that is advantageously made small and light weight, such for example as hand-carried field radios and in space applications, a dual section trimmer or two variable trimmers might occupy excessive space or restrict the shape of the resonator or oscillator package. It has been discovered that the circuit arrangement of FIGURE 6 can be packaged in smaller space and will be lighter weight without sacrificing much of the very substantial advantage that the FIGURE 5 circuit provides over the prior art. In FIGURE 6 the crystal 14 is connected between terminals Y and W, controlled capacitor 16 is connected between terminals W and X or Z, a variable trimmer capacitor 56 and a fixed capacitor 58 are connected in series from terminal Y to Z or X, and a coupling capacitor 60 is connected from terminal W to the junction of capacitors 56 and 58. It has been demonstrated by experiment that adjustment of capacitor 56 to compensate for crystal impedance change through aging has the effect in this circuit of appropriately altering the range of capacitance change across capacitor 16 from terminal X to W.

While we have selected certain specific embodiments of our invention for illustration and detailed description, we are aware that many variations thereof are possible. Accordingly, our invention is not to be limited in scope except to the degree necessitated by the prior art and the spirit of the appended claims.

We claim:

1. In a temperature compensated resonator circuit of the kind in which a semiconductor junction in series with a piezoelectric crystal is subjected to a temperature responsive compensation voltage to alter its capacitive reactance, means for compensating for crystal frequency shifts independent of temperature change comprising: the series combination of two capacitors connected in parallel with the series combination of the junction and the crystal, and a connection from the interconnection between the junction and crystal to the interconnection between said capacitors, the one of said capacitors having parallel relation to said crystal through said connection being variable.

2. The invention defined in claim 1 in which both of said capacitors are variable.

3. The invention defined in claim 1 in which said connection comprises a coupling capacitor.

References Cited

UNITED STATES PATENTS

| | | | |
|---|---|---|---|
| 3,054,966 | 9/1962 | Etherington | 331—176 X |
| 3,302,138 | 1/1967 | Brown et al. | 331—116 X |

JOHN KOMINSKI, *Primary Examiner.*

S. H. GRIMM, *Assistant Examiner.*

U.S. Cl. X.R.

331—109, 176, 177